(12) United States Patent
Yokokawa et al.

(10) Patent No.: US 12,027,823 B2
(45) Date of Patent: Jul. 2, 2024

(54) SEMICONDUCTOR LASER

(71) Applicant: Lumentum Japan, Inc., Kanagawa (JP)

(72) Inventors: Shoko Yokokawa, Kanagawa (JP); Atsushi Nakamura, Nagano (JP)

(73) Assignee: Lumentum Japan, Inc., Kanagawa (JP)

( * ) Notice: Subject to any disclaimer, the term of this patent is extended or adjusted under 35 U.S.C. 154(b) by 204 days.

(21) Appl. No.: 17/449,560

(22) Filed: Sep. 30, 2021

(65) Prior Publication Data

US 2022/0360048 A1    Nov. 10, 2022

(30) Foreign Application Priority Data

May 10, 2021 (JP) .................................. 2021-079577
Jul. 2, 2021 (JP) .................................. 2021-110929

(51) Int. Cl.
*H01S 5/22* (2006.01)
*H01S 5/10* (2021.01)
*H01S 5/12* (2021.01)
*H01S 5/227* (2006.01)
*H01S 5/34* (2006.01)

(52) U.S. Cl.
CPC .......... *H01S 5/2224* (2013.01); *H01S 5/1014* (2013.01); *H01S 5/12* (2013.01); *H01S 5/227* (2013.01); *H01S 5/34* (2013.01)

(58) Field of Classification Search
CPC .................................................... H01S 5/1014
See application file for complete search history.

(56) References Cited

U.S. PATENT DOCUMENTS

| 6,058,125 A * | 5/2000 | Thompson ............ H01S 5/1032 372/50.1 |
| 2001/0012306 A1* | 8/2001 | Yamazaki ............... H01S 5/227 372/43.01 |
| 2010/0202485 A1 | 8/2010 | Kobayashi |
| 2013/0208751 A1* | 8/2013 | Nakahara .................. H01S 5/12 372/45.011 |
| 2018/0090910 A1* | 3/2018 | Nakahara ................. G02B 6/42 |
| 2019/0013640 A1* | 1/2019 | Cheung ................. H01S 5/4062 |
| 2021/0044089 A1* | 2/2021 | Nakahara .................. H01S 5/12 |

FOREIGN PATENT DOCUMENTS

JP     2010212664 A     9/2010

* cited by examiner

*Primary Examiner* — Michael Carter
*Assistant Examiner* — Stephen Sutton Kotter
(74) *Attorney, Agent, or Firm* — Harrity & Harrity, LLP

(57) ABSTRACT

A semiconductor laser includes: a multi-quantum well layer in a mesa structure; a buried layer comprising a semi-insulating semiconductor, the buried layer being in contact with each of both sides of the mesa structure; a first cladding layer with a first conductivity type, the first cladding layer having a lower refractive index than the multi-quantum well layer; a high refractive index layer configured to not absorb light oscillating in the multi-quantum well layer, the high refractive index layer having a higher refractive index than the first cladding layer; a diffraction grating layer at least partially constituting a diffraction grating capable of diffracting the light oscillating in the multi-quantum well layer, the diffraction grating layer not contacting the high refractive index layer; a substrate with the first conductivity type; and a second cladding layer with a second conductivity type above the multi-quantum well layer.

20 Claims, 16 Drawing Sheets

SEMICONDUCTOR LASER

CROSS-REFERENCE TO RELATED APPLICATION

The present application claims priority from Japanese patent applications JP2021-079577 filed on May 10, 2021 and JP2021-110929 filed on Jul. 2, 2021, the contents of which are hereby expressly incorporated by reference herein.

TECHNICAL FIELD

This disclosure relates to a semiconductor laser.

BACKGROUND

A semiconductor laser with a buried heterostructure (BH) provides excellent power characteristics and reliability. The BH can makes an aspect ratio of output light close to 1, due to a large optical confinement coefficient to a mesa structure. Further, by broadening a mesa width, it is possible to reduce current density of a multi-quantum well (MQW), thereby achieving higher power output and higher reliability.

When the optical confinement coefficient to the mesa structure is large, an area of a near field pattern (NFP) is small, whereby a spread angle of a far field pattern (FFP) becomes large, leading to a decrease in optical coupling tolerance. Further, when the mesa width exceeds a higher-order transverse-mode cut-off width, a transverse higher-order mode appears, leading to a decrease in optical coupling efficiency, whereby power output is lowered.

In some cases, an n-InP buffer layer and an n-InGaAsP guide layer are disposed below the mesa structure. The n-InGaAsP guide layer is disposed to fill a diffraction grating. The diffraction grating is a main element that has a very large effect on optical properties, specifically, that determines κ, which is a coupling coefficient of light. Therefore, in addition to necessity of taking κ into consideration, there is less flexibility for designing the n-InGaAsP guide layer. Further, since the n-InP buffer layer is as thin as 30 nm, the n-InGaAsP guide layer below it might increase the optical confinement coefficient to the mesa structure, whereby the cut-off width might be narrowed.

SUMMARY

This disclosure improves output characteristics and reliability of a semiconductor laser.

In some implementations, a semiconductor laser includes: a multi-quantum well layer included in a mesa structure; a buried layer comprising a semi-insulating semiconductor, the buried layer being in contact with each of both sides of the mesa structure; a first cladding layer with a first conductivity type, under the mesa structure and the buried layer, the first cladding layer having a lower refractive index than the multi-quantum well layer; a high refractive index layer configured to not absorb light oscillating in the multi-quantum well layer, under the mesa structure and the buried layer, below the first cladding layer, the high refractive index having a higher refractive index than the first cladding layer; a diffraction grating layer at least partially constituting a diffraction grating capable of diffracting the light oscillating in the multi-quantum well layer, the diffraction grating layer not contacting the high refractive index layer; a substrate with the first conductivity type, below the high refractive index layer; and a second cladding layer with a second conductivity type opposite to the first conductivity type, above the multi-quantum well layer.

The high refractive index layer with the high refractive index expands distribution of light. Thus, the higher-order transverse-mode cut-off width becomes larger, the area of the NFP becomes larger, and the spread angle of the FFP becomes smaller, whereby the output characteristics and reliability are improved.

DETAILED DESCRIPTION

Figure 1:
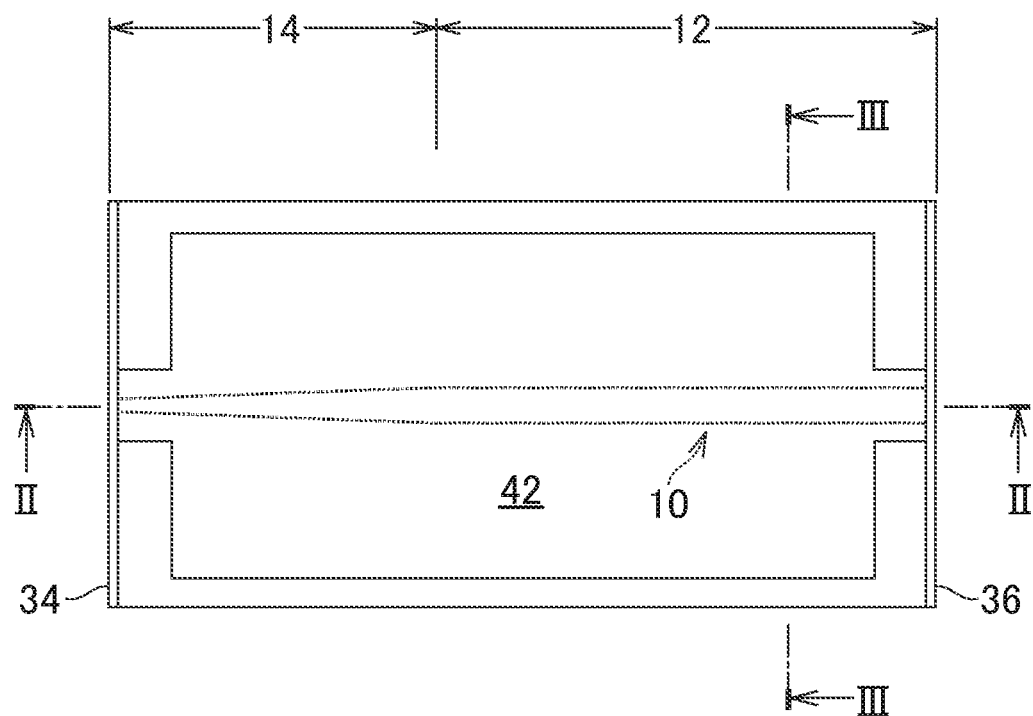
FIG. 1 is a plan view of a semiconductor laser according to a first example implementation.

Some implementations are specifically described in detail in the following with reference to drawings. In the drawings, the same members are denoted by the same reference numerals and have the same or equivalent functions, and a repetitive description thereof is omitted. The size of the figure does not necessarily coincide with the magnification.

Silicon photonics, which has attracted attention in recent years, inherently requires a high-power semiconductor optical device, in particular, a high-power semiconductor laser. A ridge-type or a buried heterostructure (BH) is known to be one of structures of the semiconductor laser. A semiconductor laser having the BH is called a BH-type semiconductor laser.

In a ridge-type semiconductor laser, a multi-quantum well (MQW) spreads widely on a substrate, while a semiconductor layer (mainly cladding layer) on it is provided with a ridge portion. Side surfaces of the ridge portion are covered with an insulating film or a semiconductor layer. In a BH-type semiconductor laser, the semiconductor layer including the MQW has a mesa structure (stripe shape), while a buried layer comprising a semi-insulating semiconductor is adjacent to both sides of the mesa structure.

Comparing the ridge-type semiconductor laser and the BH-type semiconductor laser, the BH-type semiconductor laser has both sides of the MQW covered with a buried layer that has high thermal conductivity and that provides excellent heat dissipation.

In the BH-type semiconductor laser, generally, the MQW is surrounded on the top, bottom, left, and right with substantially the same semiconductor materials (e.g., InP), and surface irregularities are smaller than the ridge-type semiconductor laser, whereby stress applied to the MQW is small. Therefore, from a viewpoint of reliability due to a stress, the BH-type semiconductor laser is superior to the ridge-type semiconductor laser.

A shape of output light affects optical coupling characteristics with external optical components. If the optical coupling efficiency is poor, the output light intensity of the semiconductor laser cannot be sufficiently utilized even if it is large. For example, when a semiconductor laser is optically coupled to a lens, a spread angle of a far field pattern (FFP) of the output light of the semiconductor laser should be small, from viewpoints of the optical coupling efficiency and tolerance at a time of adjusting optical axes, and an aspect ratio should be close to 1. The BH-type semiconductor laser generally has the aspect ratio of the output light that is closer to 1 than the ridge-type semiconductor laser, being superior in the optical coupling characteristics.

For the above reasons, the semiconductor laser with the BH satisfies high-power characteristics and provides high reliability. Further, the ridge-type semiconductor laser and the BH-type semiconductor laser can be optimized to provide a semiconductor laser which can withstand sufficient practical use.

Figure 2:
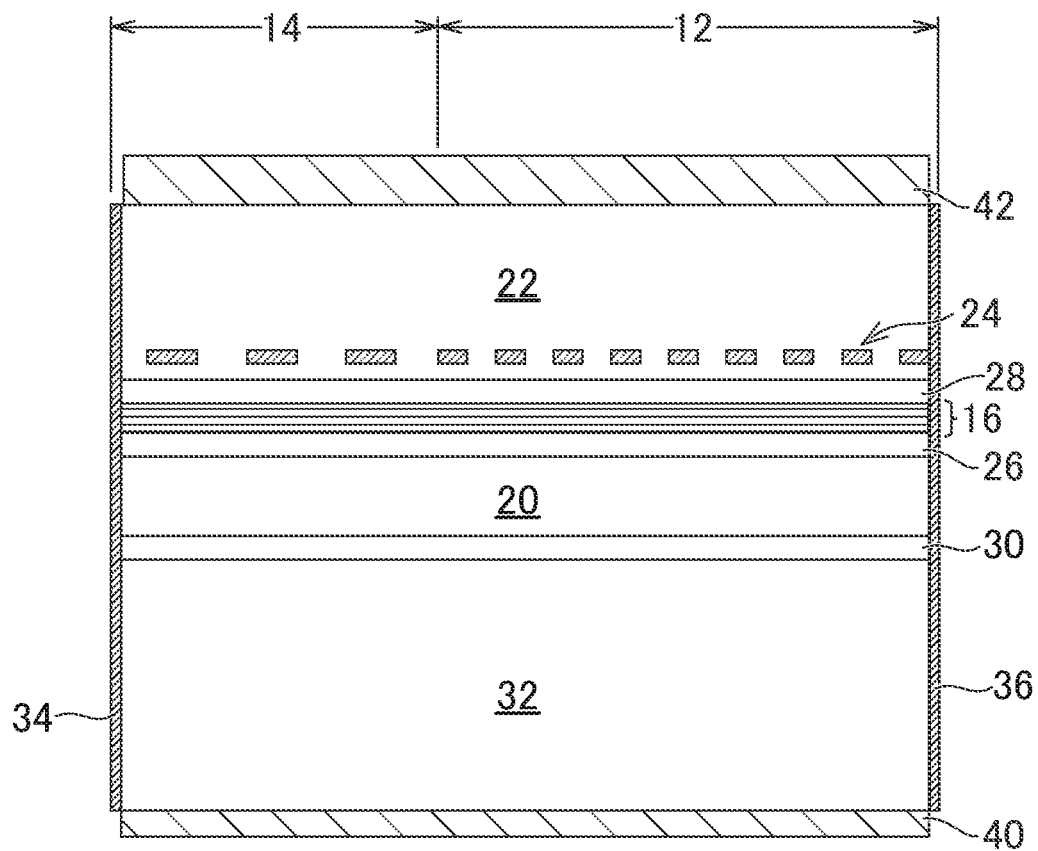
FIG. 2 is a II-II cross-sectional view of the semiconductor laser shown in FIG. 1.
Figure 3:
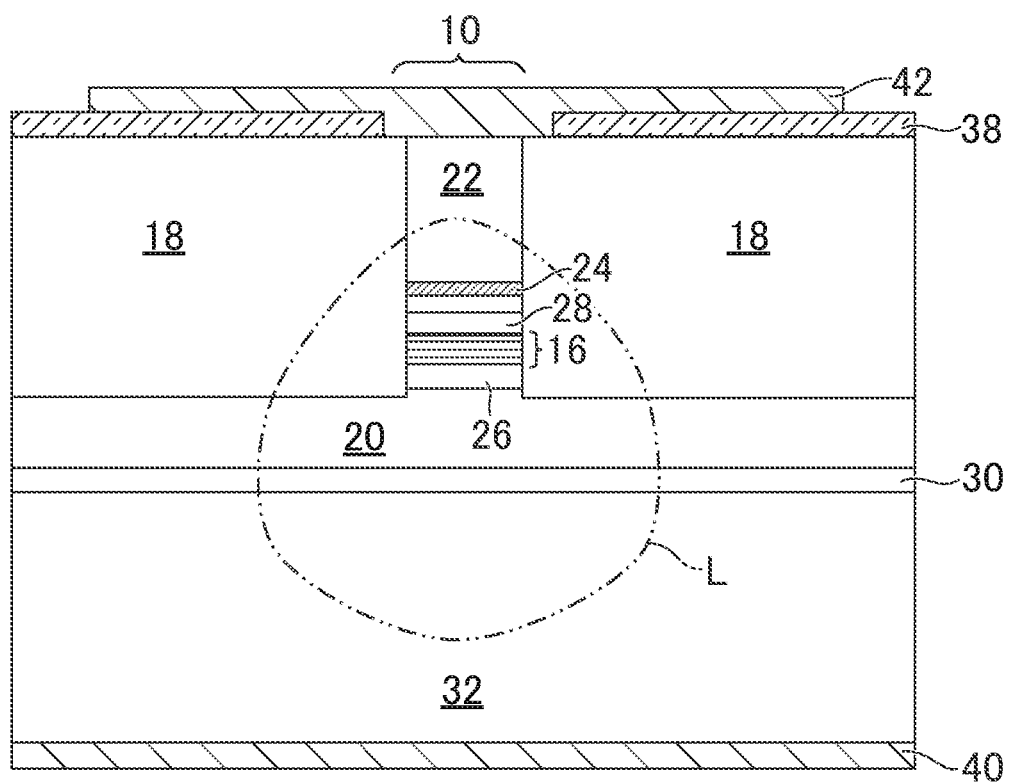
FIG. 3 is a cross-sectional view of the semiconductor laser shown in FIG. 1.

FIG. 1 is a plan view of a semiconductor laser according to a first example implementation. FIG. 2 is a II-II cross-sectional view of the semiconductor laser shown in FIG. 1. FIG. 3 is a cross-sectional view of the semiconductor laser shown in FIG. 1. The semiconductor laser is a BH-type semiconductor laser, which may be a continuous oscillation laser or a direct modulation laser.

The semiconductor laser may include a mesa structure 10. The mesa structure 10 may include a laser oscillator section 12 capable of laser oscillation of light with a predetermined wavelength. The laser oscillator section 12 may be configured to output continuous light. The oscillation wavelength of the laser oscillator section 12 may be a 1.3 μm band or may be another wavelength band, such as a 1.55 μm band. The laser oscillator section 12 may be a distributed feedback (DFB) laser. The mesa structure 10, at the laser oscillator section 12, may have a width (mesa width) of 1.7 μm.

The mesa structure 10 may include a spot size converter section 14. The spot size converter section 14 may be adjacent to the laser oscillator section 12. The spot size converter section 14 gradually decreases in width (mesa width) perpendicular to a light emission direction. As the mesa width decreases, an optical confinement coefficient of the mesa structure 10 decreases. The spot size converter section 14 may be configured to adjust an area of the NFP and adjust a spread angle of the FFP, by adjusting an emission area of a laser beam.

The laser oscillator section 12 and the spot size converter section 14 may include one common p-i-n structure. The "one common p-i-n structure" in this disclosure means a p-i-n structure comprised of the same materials and formed by the same processes. Since they have the one common p-i-n structure, a gain band stays static from the laser oscillator section 12 to the spot size converter section 14. The gain band may be a wavelength range of a gain spectrum. The mesa structure 10 may be comprised of some layers of the p-i-n structure.

The semiconductor laser may include a multi-quantum well layer 16. The multi-quantum well layer 16 may be included in the mesa structure 10. The multi-quantum well layer 16 may have a multiple structure where some quantum well layers and some barrier layers may be alternately stacked to be 100 nm in total layer thickness. The multi-quantum well layer 16 may be comprised of InGaAsP or may be comprised of InGaAlAs.

The semiconductor laser may include a buried layer 18. The buried layer 18 may be in contact with each of two sides of the mesa structure 10. Each of the two sides of the mesa structure 10 may be covered with the buried layer 18. The buried layer 18 may be made of a semi-insulating semiconductor. The buried layer 18 may comprise semi-insulating InP (e.g., Fe—InP).

The semiconductor laser may include a first cladding layer 20. The first cladding layer 20 may be below the mesa structure 10 and the buried layer 18. A portion (e.g., a protrusion on a top surface) of the first cladding layer 20 may be included in the mesa structure 10. Alternatively, the first cladding layer 20 may not be included in the mesa structure 10. The first cladding layer 20 may comprise InP. InP may be higher in thermal conductivity than InGaAsP for example, so the first cladding layer 20 may be made of InP to increase heat dissipation from the multi-quantum well layer 16. The first cladding layer 20 may have a first conductivity type (e.g., n-type). The first cladding layer 20 may be lower in refractive index than the multi-quantum well layer 16. The first cladding layer 20 may have a thickness of 500 nm or more (e.g., 1000 nm) and 1500 nm or less.

The semiconductor laser may include a second cladding layer 22. The second cladding layer 22 may be on the multi-quantum well layer 16. The second cladding layer 22 may have a second conductivity type (e.g., p-type) opposite to the first conductivity type. The second cladding layer 22 may be included in the mesa structure 10. The second cladding layer 22 may comprise InP and may have a thickness of 2000 nm.

The semiconductor laser may include a diffraction grating layer 24. The diffraction grating layer 24 may comprise InGaAsP and may have a thickness of 10 nm. The diffraction grating layer 24 may be inside the second cladding layer 22. The diffraction grating layer 24 may be included in the mesa structure 10. The diffraction grating layer 24 at least partially constitutes a diffraction grating capable of diffracting light oscillating in the multi-quantum well layer 16. For example, the diffraction grating layer 24, corresponding to composition of the multi-quantum well layer 16, may be configured to permit the laser oscillator section 12 to emit light in a 1.3 μm band.

The diffraction grating layer 24, at the spot size converter section 14, constitutes a grating configured to not diffract the light oscillating in the multi-quantum well layer 16. For example, the diffraction grating layer 24, at the spot size converter section 14, may include a grating with spacing where neither refraction nor reflection for the 1.3 μm band occurs. That is, the diffraction grating layer 24 may include a grating with spacing configured not to effectively serve as a diffraction grating. Alternatively, the diffraction grating layer 24 may not include a grating at the spot size converter section 14. The spot size converter section 14 and the laser oscillator section 12 may have structural differences only in the mesa width and the diffraction grating.

The semiconductor laser may include a first separate confinement heterostructure (SCH) layer 26. The first SCH layer 26 may be between the multi-quantum well layer 16 and the first cladding layer 20. The first SCH layer 26 may be included in the mesa structure 10. The first SCH layer 26 may have the first conductivity type. The first SCH layer 26 may comprise InGaAsP and may have a thickness of 50 nm. Alternatively, the first SCH layer 26 may comprise InGaAlAs.

The semiconductor laser may include a second SCH layer 28. The second SCH layer 28 may be between the multi-quantum well layer 16 and the second cladding layer 22. The second SCH layer 28 may be included in the mesa structure 10. The second SCH layer 28 may have the second conductivity type. The second SCH layer 28 may comprise InGaAsP and may have a thickness of 50 nm. Alternatively, the second SCH layer 28 may comprise InGaAlAs. The second SCH layer 28 may be the same in composition wavelength as the first SCH layer 26, but they may be different.

The semiconductor laser may include a high refractive index layer 30. The high refractive index layer 30 may be below the mesa structure 10 and the buried layer 18. The high refractive index layer 30 may not be included in the mesa structure 10. The diffraction grating layer 24 may not be in contact with the high refractive index layer 30. The diffraction grating layer 24 may be provided separately from the high refractive index layer 30, so design flexibility is high. The high refractive index layer 30 may be wider than the mesa structure 10 and may overlap with at least part of the buried layer 18, but may not overlap with the entire buried layer 18.

The high refractive index layer 30 may be under the first cladding layer 20. The high refractive index layer 30 may have a higher refractive index than the first cladding layer 20. The high refractive index layer 30 may have a lower refractive index than the multi-quantum well layer 16. The high refractive index layer 30 may have a composition wavelength set to not absorb the light oscillated by the semiconductor laser. Here, not absorbing the light means that the composition wavelength of the high refractive index layer 30 may be shorter than a center of the oscillation wavelength of the semiconductor laser, not necessarily meaning that absorbing no wavelengths at all included in the optical spectrum of the semiconductor laser. The high refractive index layer 30 may have a thickness of 50 nm or more. The high refractive index layer 30 may have a thickness of 100 nm or less. The high refractive index layer 30 may comprise at least one of InGaAsP, InGaAs, or InGaAlAs. The high refractive index layer 30 may have the first conductivity type. The high refractive index layer 30 with the high refractive index may expand distribution of light L. However, due to the first cladding layer 20 having a sufficient thickness, the expansion of the distribution of the light L fails to lead to an increase in the optical confinement coefficient of the multi-quantum well layer 16.

The semiconductor laser may include a substrate 32. The substrate 32 may be under the high refractive index layer 30. The substrate 32 may have the first conductivity type. The substrate 32 may comprise InP.

The semiconductor laser may include a low reflection coating film 34 on a laser emitting surface. The semiconductor laser may include a high reflection coating film 36 on a surface opposite to the laser emitting surface. On an upper surface of the buried layer 18, except in a vicinity of the mesa structure 10, an insulating film 38 may be disposed.

The semiconductor laser may include a back electrode 40 on a back side. The semiconductor laser may include a top electrode 42 on the second cladding layer 22. An unillustrated contact layer may be interposed between the second cladding layer 22 and the top electrode 42. The back electrode 40 and the top electrode 42 may be used to inject a current from an external power source (not shown) to the semiconductor laser.

The back electrode 40 and the top electrode 42 may be provided not only at the laser oscillator section 12 but also at the spot size converter section 14. This may be for driving the laser oscillator section 12 and also for utilizing the spot size converter section 14 as an amplifier. Alternatively, the top electrode 42 may not be on the spot size converter section 14. Or, an unillustrated top electrode, separate from the top electrode 42 of the laser oscillator section unit 12, may be disposed on the spot size converter section 14. Further, an unillustrated window structure, comprising Fe—InP for example, may be provided at a front end of the spot size converter section 14.

Figure 4:
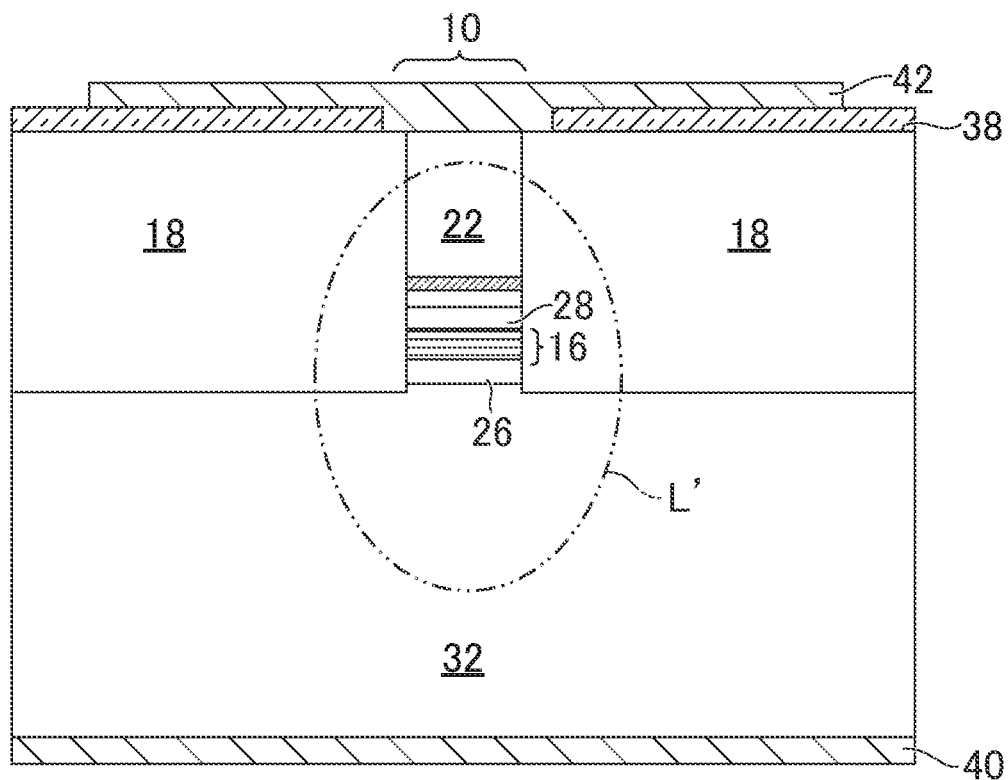
FIG. 4 is a cross-sectional view of a laser oscillator section of a semiconductor laser according to a comparative example.

FIG. 4 is a cross-sectional view of a laser oscillator section of a semiconductor laser according to a comparative example. The laser oscillator section is different from the laser oscillator section 12 in the first example implementation in that it has neither the first cladding layer 20 nor the high refractive index layer 30. They are the same in other features such as materials and composition wavelengths.

In this comparative example, light L' oscillating in the laser oscillator section seeps from the first SCH layer 26, the multi-quantum well layer 16, and the second SCH layer 28 into the second cladding layer 22, the buried layer 18, and the substrate 32, which have a low refractive index. Therefore, the light L' is guided around the first SCH layer 26, the multi-quantum well layer 16, and the second SCH layer 28. Regions (buried layer 18, substrate 32), on both sides of a region in and below the mesa structure 10 and where the light L' is strongly gathered, are made of materials (e.g., InP) with a low refractive index. Note that the distributions of the light L and the light L' are only schematically shown in order to explain the difference between the first example implementation and the comparative example, and do not necessarily coincide with the NFP.

A comparison was run to find a cut-off width, a vertical FFP, a horizontal FFP, and an aspect ratio (vertical/horizontal) in the first example implementation and the comparative example. The mesa width was 1.7 μm. The aspect ratio was vertical FFP/horizontal FFP. The results are shown in Table 1.

TABLE 1

| | RESULTS | | | |
|---|---|---|---|---|
| | CUT-OFF WIDTH | VERTICAL FFP | HORIZONTAL FFP | ASPECT RATIO |
| FIRST EXAMPLE IMPLEMENTATION | 1.74 μm | 25.8° | 19.2° | 1.34 |
| COMPARATIVE EXAMPLE | 1.64 μm | 27.9° | 20.4° | 1.37 |

As is clear from the results, effects of broadening the cut-off width and reducing the FFP are obtained in the first example implementation.

In the first example implementation, below the mesa structure 10, the high refractive index layer 30 (e.g., InGaAsP) has a higher refractive index than the first cladding layer 20 (e.g., InP). Therefore, as compared with the comparative example, the overall distribution of the light L is broadened in a downward direction by the high refractive index layer 30. Moreover, since the high refractive index layer 30 spreads under the buried layer 18, the distribution of the light L is also broadened in a horizontal direction.

In the first embodiment, the refractive index of the regions on the both sides of the region where the light L is strongly gathered is large, as compared with the comparative example. As a result, the refractive index difference, between the region where the light L is strongly gathered and the regions on the both sides thereof, becomes small. When the refractive index difference decreases, the higher-order transverse-mode cut-off width (hereinafter, cut-off width) is broadened. If the cut-off width is broadened, the mesa width can be broadened without generating a high-order mode in the horizontal direction, thereby making it possible to reduce a current density of the multi-quantum well layer 16. This can improve reliability and achieve higher power output due to more current being injected.

Dependency of the thickness of the first cladding layer 20 was examined. Specifically, a comparison was performed on how characteristics would change when the thickness of the first cladding layer 20 varied. The mesa width was 1.7 μm, and the thickness of the high refractive index layer 30 was 50 nm.

Figure 5A:
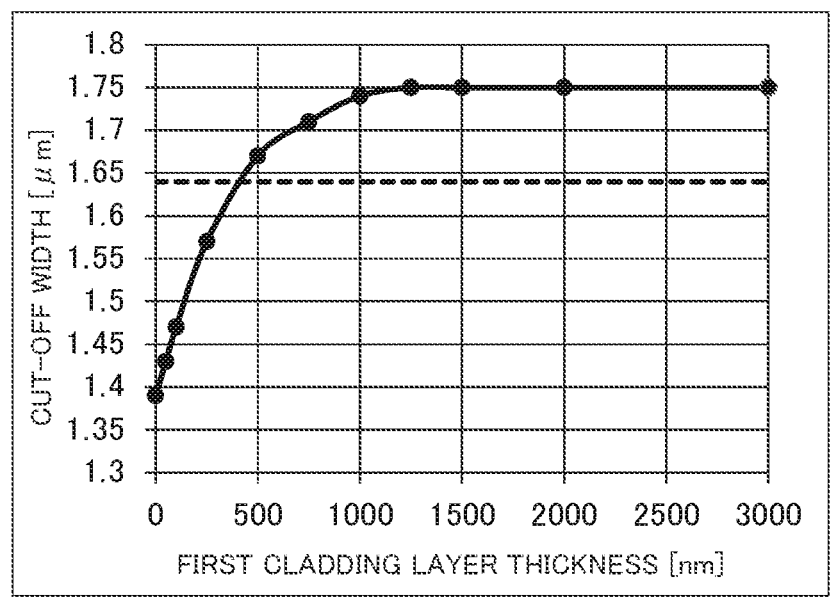
FIG. 5A is a diagram of comparison results of cut-off widths in proportion to a first cladding layer.

FIG. 5A is a diagram of comparison results of cut-off widths in proportion to a first cladding layer 20. A broken line indicates a value of the cut-off width in the comparative example shown in Table 1. When the thickness of the first cladding layer 20 is less than 500 nm, the cut-off width is narrower than that in the comparative example. This is because an effect of gathering the light in the mesa structure 10 is strongly exhibited due to the high refractive index layer 30 being close to the mesa structure 10. Therefore, the thickness of the first cladding layer 20 may be 500 nm or more. Further, when the thickness exceeds 1000 nm, the cut-off width becomes substantially constant, so the characteristics can be stabilized by setting the thickness to 1000 nm or more.

Figure 5B:
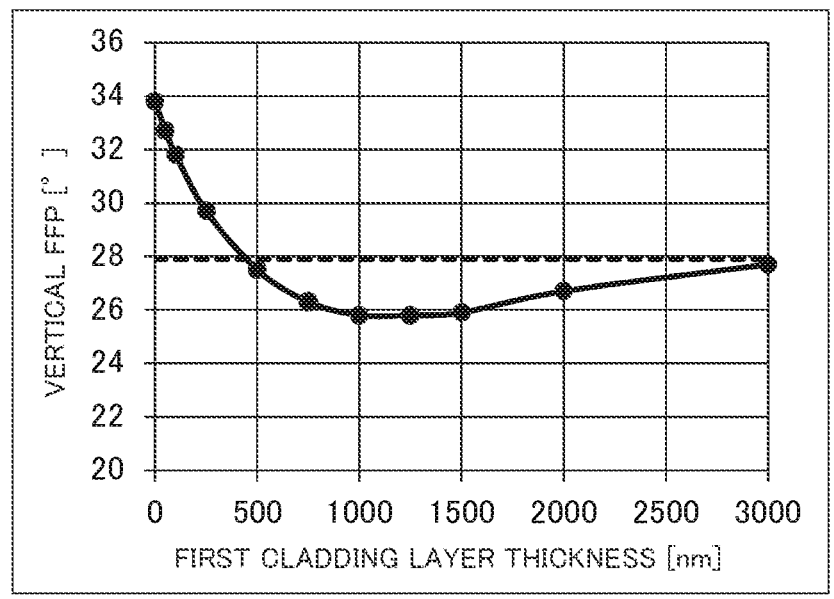
FIG. 5B is a diagram of comparison results of vertical FFPs in proportion to the first cladding layer.

FIG. 5B is a diagram of comparison results of vertical FFPs in proportion to the first cladding layer 20. A broken line indicates a value of the vertical FFP in the comparative example shown in Table 1. When the thickness of the first cladding layer 20 is less than 500 nm, the Vertical FFP is larger than that in the comparative example. Therefore, the thickness of the first cladding layer 20 may be 500 nm or more.

Figure 5C:
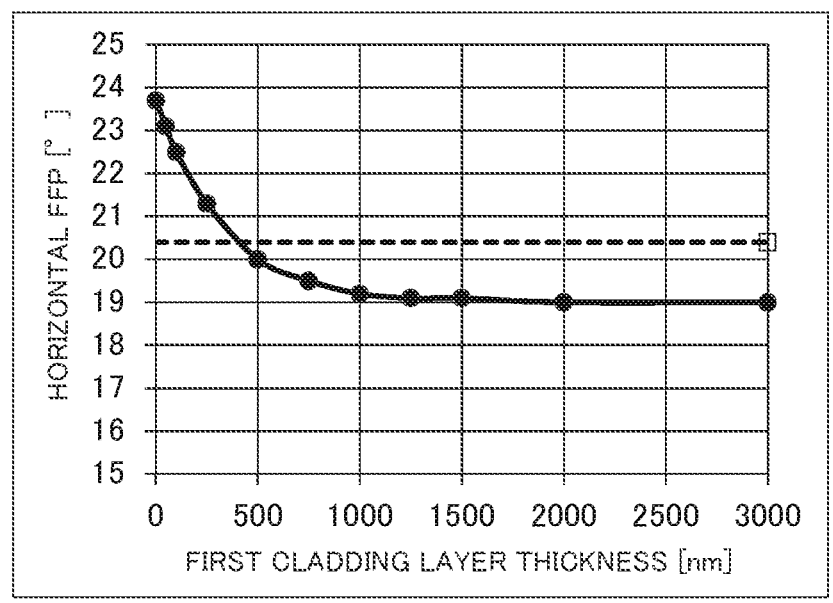
FIG. 5C is a diagram of comparison results of horizontal FFPs in proportion to the first cladding layer.

FIG. 5C is a diagram of comparison results of horizontal FFPs in proportion to the first cladding layer 20. A broken line indicates a value of the horizontal FFP in the comparative example shown in Table 1. When the thickness of the first cladding layer 20 is less than 500 nm, the horizontal FFP is larger than that in the comparative example. Therefore, the thickness of the first cladding layer 20 may be 500 nm or more.

Figure 5D:
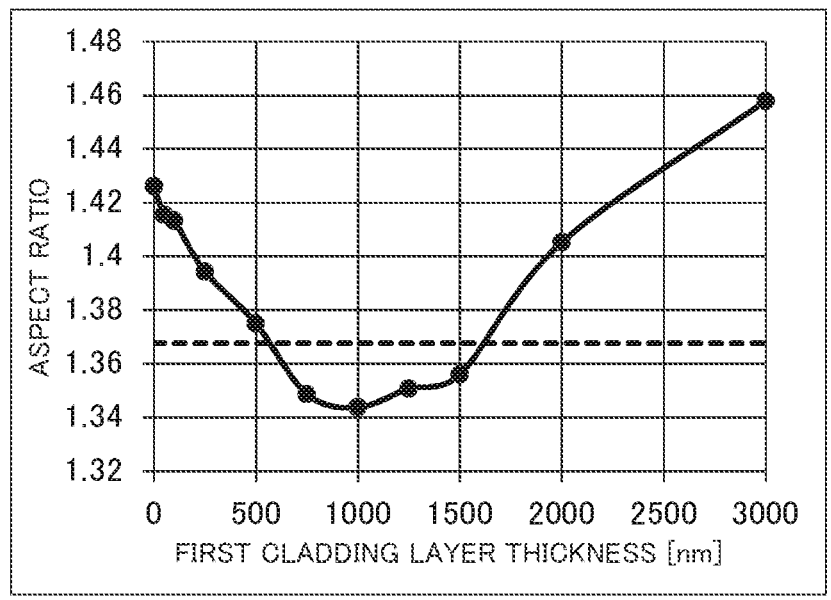
FIG. 5D is a diagram of comparison results of aspect ratios in proportion to the first cladding layer.

FIG. 5D is a diagram of comparison results of aspect ratios in proportion to the first cladding layer 20. A broken line indicates a value of the aspect ratio in the comparative example shown in Table 1. The aspect ratio is vertical FFP/horizontal FFP. The aspect ratio may be minimized when the thickness of the first cladding layer 20 may be around 1000 nm, and there may be a tendency that it increases when it exceeds 1500 nm. Since the aspect ratio required depends on a lens used, the thickness of the first cladding layer 20 may be set accordingly.

Next, dependency of the thickness of the high refractive index layer 30 was examined. In detail, a comparison was carried out on how the characteristics would change when the thickness of the high refractive index layer 30 varied. The mesa width was 1.7 μm, and the thickness of the first cladding layer 20 was 1000 nm.

Figure 6A:
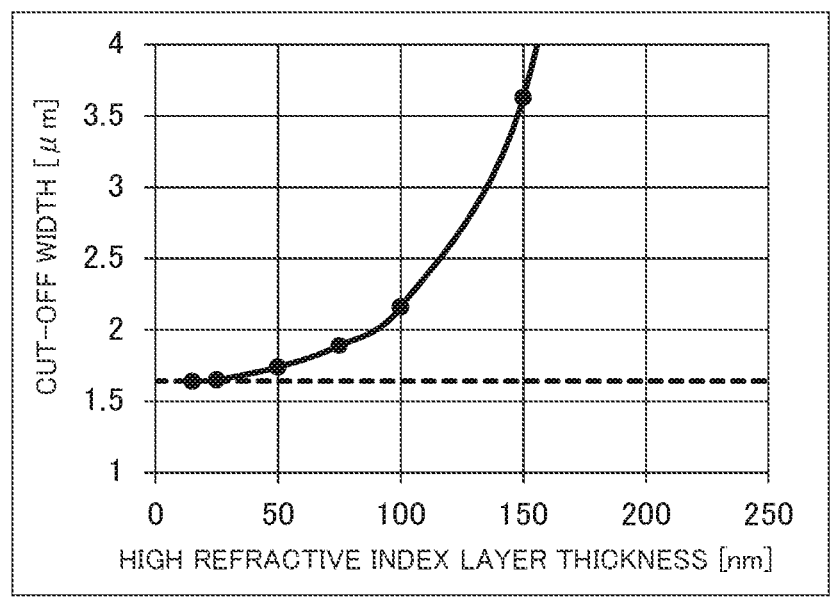
FIG. 6A is a diagram of comparison results of cut-off widths in proportion to a high refractive index layer.

FIG. 6A is a diagram of comparison results of cut-off widths in proportion to a high refractive index layer 30. A broken line indicates a value of the cut-off width in the comparative example shown in Table 1. When the thickness of the high refractive index layer 30 is 30 nm or less, it is found that the cut-off width is almost the same as that in the comparative example, having little effect. If the thickness of the high refractive index layer 30 is 50 nm or more, the cut-off width increases.

Figure 6B:
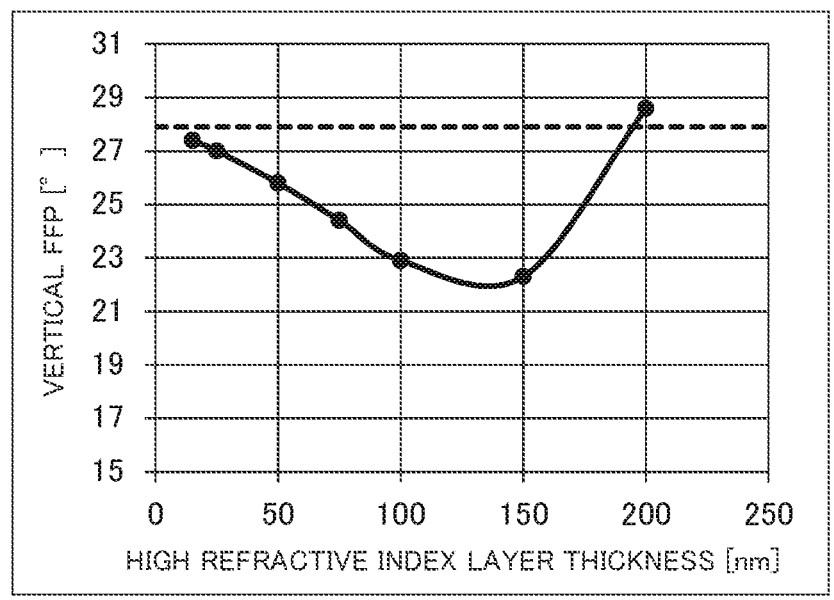
FIG. 6B is a diagram of comparison results of vertical FFPs in proportion to the high refractive index layer.

FIG. 6B is a diagram of comparison results of vertical FFPs in proportion to the high refractive index layer 30. A broken line indicates a value of the Vertical FFP in the comparative example shown in Table 1. As the high refractive index layer 30 becomes thicker, the value of the vertical FFP becomes smaller. However, it is found that when the thickness of the high refractive index layer 30 exceeds 150 nm, the value of the vertical FFP tends to increase rapidly.

Figure 6C:
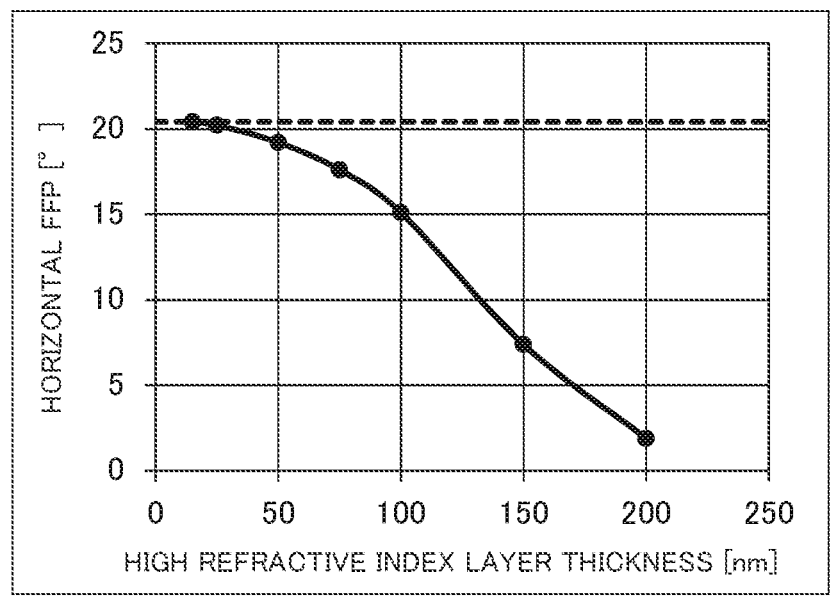
FIG. 6C is a diagram of comparison results of horizontal FFPs in proportion to the high refractive index layer.

FIG. 6C is a diagram of comparison results of horizontal FFPs in proportion to the high refractive index layer 30. A broken line indicates a value of the horizontal FFP in the comparative example shown in Table 1. As the high refractive index layer 30 becomes thicker, the value of the FFP becomes smaller. The horizontal FFP tends to decrease monotonically.

Figure 6D:
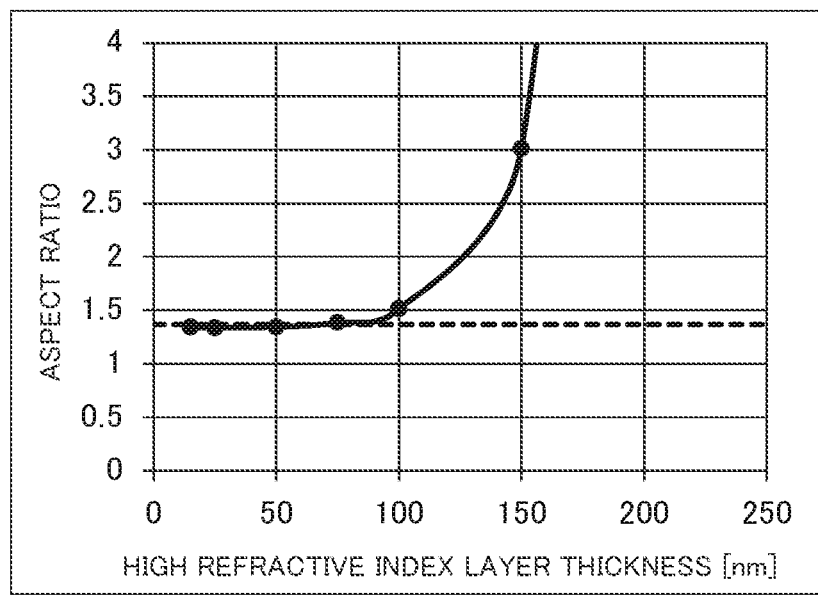
FIG. 6D is a diagram of comparison results of aspect ratios in proportion to the high refractive index layer.

FIG. 6D is a diagram of comparison results of aspect ratios in proportion to the high refractive index layer 30. A broken line indicates a value of the aspect ratio in the comparative example shown in Table 1. The aspect ratio is vertical FFP/horizontal FFP. The aspect ratio tends to increase significantly when or after the high refractive index layer 30 exceeds 100 nm.

From the above, from a viewpoint of the cut-off width, the thickness of the high refractive index layer 30 may be more than 50 nm, irrespective of how large. On the other hand, the high refractive index layer 30 may be 100 nm or less if the FFP, in particular, the aspect ratio is taken into consideration.

The numerical values in this example implementation may be merely examples. The thicknesses of the first cladding layer 20 and the thickness of the high refractive index layer 30 may be appropriately selected in accordance with required characteristics. However, as is apparent from FIG. 5A, in order to obtain a satisfactory effect, the first cladding layer 20 may be 500 nm or more. If it is thinner than that, there is a concern that the optical confinement coefficient of the multi-quantum well layer 16 increases. The thickness of the high refractive index layer 30 may be 50 nm or more.

Since the high refractive index layer 30 may have a uniform width, the spot size converter section 14, which may be narrower in the width than the laser oscillator section 12, shapes the overall distribution of the light L close to the high refractive index layer 30. Since the high refractive index layer 30 may not be part of the mesa structure 10 and may be widely spread, the light L also spreads horizontally. As a result, it is possible to increase the vertical and horizontal FFPs. For example, when the mesa width of a tip of the spot size converter section 14 is 0.9 then the vertical FFP is 22.3°, the horizontal FFP is 16.1°, and the aspect ratio is 1.38. As compared with the light distribution of the laser oscillator section 12 shown in Table 1, the FFP may be reduced without changing the aspect ratio. As a result, a tolerance of optical coupling with a lens or a waveguide can be improved.

The high refractive index layer 30 having the high refractive index expands the distribution of the light L in the vertical direction and the horizontal direction. Thus, the area of the NFP becomes larger and the spread angle of the FFP becomes smaller, leading to an improved reliability such as a larger tolerance of the optical coupling with an optical component such as a lens.

The high refractive index layer 30 having the high refractive index increases the high-order transverse mode cut-off width. Therefore, the mesa width can be increased. When the mesa width is broader, since current density of the mesa structure 10 becomes lower, it is possible to inject more current, thereby achieving the high power output.

With the high refractive index layer 30 having the high refractive index, the distribution of the light L expands downward (toward the substrate 32). Thus, a higher power output is possible, although depending on materials. For example, a lower n-type semiconductor layer such the first cladding layer 20 or the high refractive index layer 30 is smaller in light absorption amount than an upper p-type semiconductor layer such as the second cladding layer 22. This diminishes an optical confinement coefficient of the upper semiconductor layer, minimizes internal loss due to light absorption, and intensifies the power output.

To sufficiently achieve the effects of the first example implementation, the high refractive index layer 30 may have a composition wavelength that does not absorb the light oscillating in the multi-quantum well layer 16, also may have a higher refractive index than the first cladding layer 20, and may comprise InGaAsP, InGaAlAs, or InGaAs.

The first cladding layer 20 may comprise a material (e.g., InP) having a smaller refractive index than that of either of the high refractive index layer 30 and the first SCH layer 26. If the first cladding layer 20 is made of a material having a larger refractive index than that of InP, the distribution of the light L may be closer to the multi-quantum well layer 16. Adjusting thickness and composition may achieve the effects described above, but design flexibility decreases. Furthermore, from a viewpoint of higher power output, heat generated in the multi-quantum well layer 16 may be dissipated to other regions.

The first conductivity type in the example implementation described above may be the n-type and the second conductivity type may be the p-type, but vice versa is applicable. If the first conductivity type is the p-type, the high refractive index layer 30 may be in the p-type, so the internal loss may be likely to increase and the higher power output cannot be sufficiently achieved, but it is possible to broaden the cut-off width, so the higher output can be achieved by injecting more current. In addition, the effect of decreasing the spread angle of the FFP can be sufficiently achieved.

Figure 7:
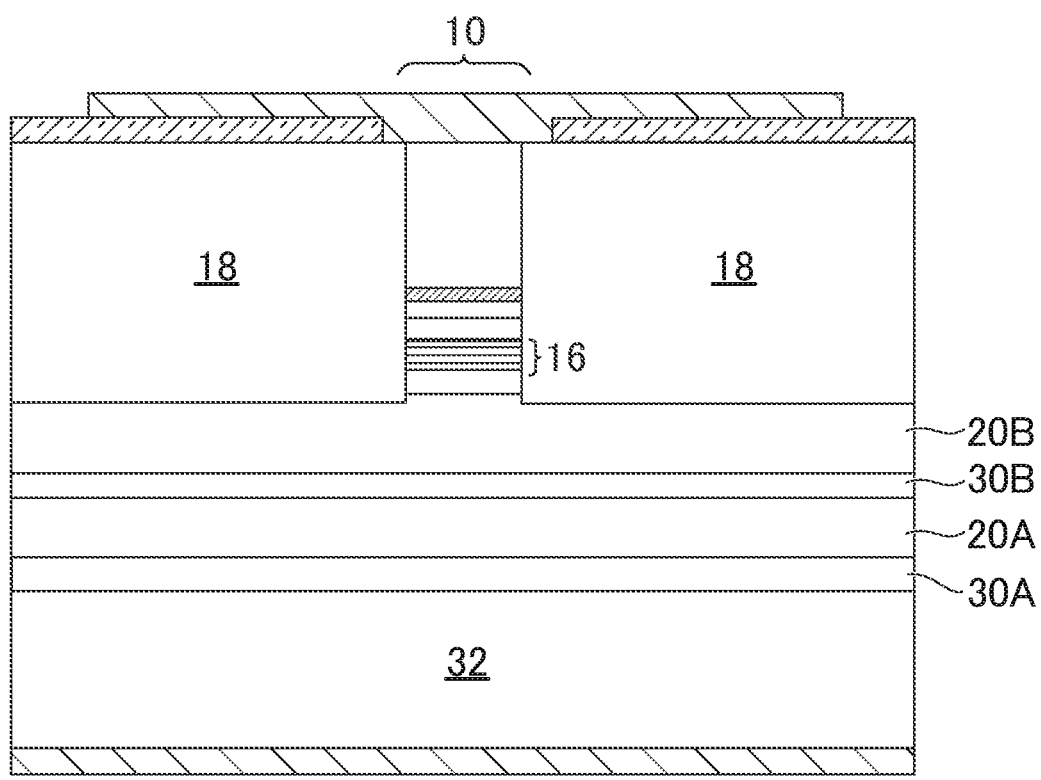
FIG. 7 is a cross-sectional view of a semiconductor laser according to modified configuration 1.

FIG. 7 is a cross-sectional view of a semiconductor laser according to a modified configuration 1. The first cladding layers 20A, 20B and the high refractive index layers 30A, 30B may be alternately stacked. The high refractive index layer 30A, the first cladding layer 20A, the high refractive index layer 30B, and the first cladding layer 20B may be disposed on the substrate 32. The first cladding layer 20B may have a projection portion serving as a lower end portion of the mesa structure 10.

The first cladding layers 20A, 20B may be different in thicknesses, being thicker when closer to the multi-quantum well layer 16. The first cladding layer 20A may comprise n-InP and may have a thickness of 750 nm. The first cladding layer 20B may comprise n-InP and may have a thickness of 1000 nm.

The high refractive index layers 30A, 30B may consist of two layers: an upper layer close to the multi-quantum well layer 16, and a lower layer far from the multi-quantum well layer 16. The upper layer may be thinner than the lower layer. The high refractive index layer 30A may be the lower layer, may comprise n-InGaAsP, and may have a thickness of 75 nm. The high refractive index layer 30B may be the upper layer, may comprise n-InGaAsP, and may have a thickness of 50 nm.

When the structure of the modified configuration 1 is employed, the cut-off width becomes 2.07 μm, which is broader than the 1.74 μm cut-off width in the laser oscillator section 12 in the first example implementation. Further, when the mesa width is 1.7 μm, then the vertical FFP becomes 22.4°, and the horizontal FFP becomes 15.9°, both being less than those in the laser oscillator section 12 in the first example implementation. Further, the aspect ratio may be 1.41.

In this modified configuration, when the spot size converter section 14 is applied and the mesa width is 0.9 μm, the vertical FFP becomes 18.1° and the horizontal FFP becomes 12.3°. The aspect ratio becomes 1.47, but it is not so large as an absolute value, and the benefit of the higher power output by increasing the cut-off width is large, whereby the higher power output can be achieved as a total.

Figure 8:
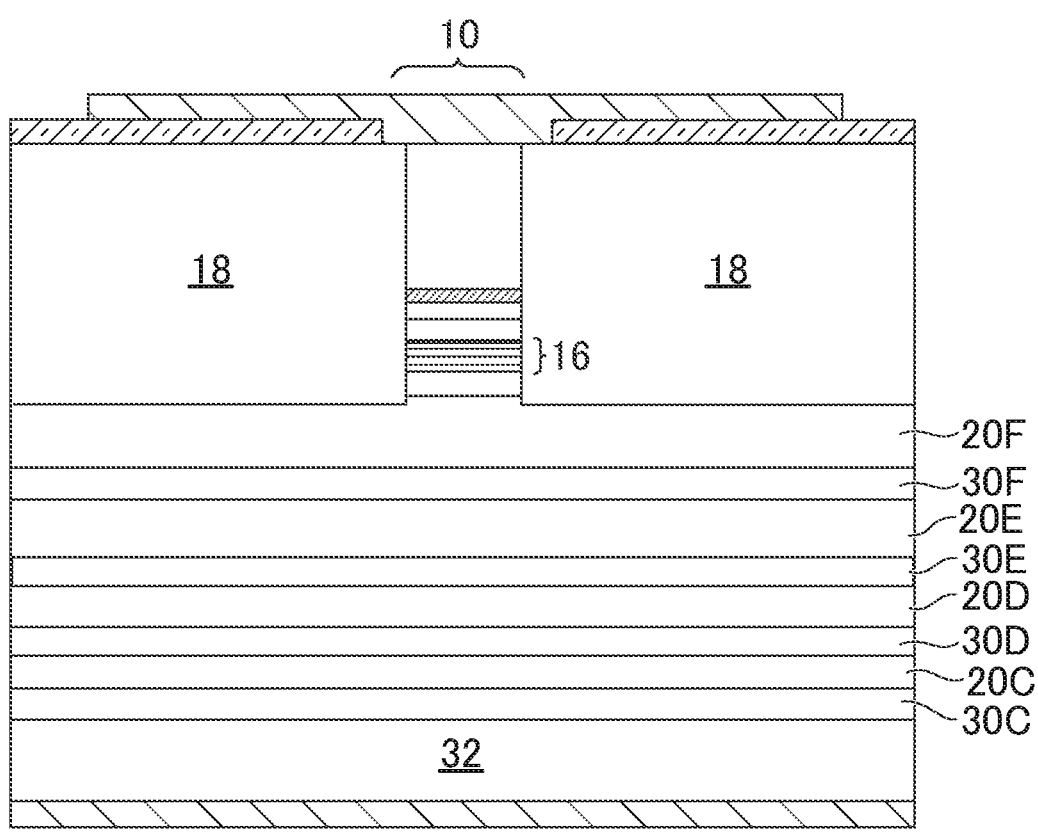
FIG. 8 is a cross-sectional view of a semiconductor laser according to modified configuration 2.

FIG. 8 is a cross-sectional view of a semiconductor laser according to a modified configuration 2. The first cladding layers 20C, 20D, 20E, 20F and the high refractive index layers 30C, 30D, 30E, 30F may be alternately stacked. The high refractive index layer 30C, the first cladding layer 20C, the high refractive index layer 30D, the first cladding layer 20D, the high refractive index layer 30E, the first cladding layer 20E, the high refractive index layer 30F, and the first cladding layer 20F may be disposed on the substrate 32. The first cladding layer 20F may have a projection portion serving as a lower end portion of the mesa structure 10.

The first cladding layers 20C, 20D, 20E, 20F may be different in thicknesses, being thicker when closer to the multi-quantum well layer 16. The first cladding layers 20C, 20D, 20E, 20F may comprise n-InP, and may have thicknesses of 600 nm, 800 nm, 1000 nm, and 1200 nm, respectively, in order from a lowermost layer.

The high refractive index layers 30C, 30D, 30E, 30F may include an uppermost layer closest to the multi-quantum well layer 16, a lowermost layer farthest from the multi-quantum well layer 16, and at least one intermediate layer between the uppermost layer and the lowermost layer. The at least one intermediate layer may be thinner than either of the uppermost layer and the lowermost layer. The high refractive index layers 30C, 30D, 30E, 30F may comprise n-InGaAsP. In thickness, each of the high refractive index layers 30C, 30F as the lowermost layer and the uppermost layer may be 70 nm, and each of the high refractive index layers 30D, 30E as the intermediate layers may be 50 nm.

When the structure of this modified configuration is employed, the cut-off width becomes 2.23 which is broader as compared with the laser oscillator section 12 in the first example implementation and the laser oscillator section 12 in the modified configuration 1. Further, when the mesa width is 1.7 then the vertical FFP becomes 21.9°, and the horizontal FFP becomes 14.5°, both being smaller than those at the laser oscillator section 12 in the first example implementation. The aspect ratio increases to 1.51.

In this modified configuration, when the spot size converter section 14 is applied and the mesa width is 0.9 then the vertical FFP becomes 14.7° and the horizontal FFP becomes 10.9°. Furthermore, the aspect ratio becomes 1.34, which is equal to the laser oscillator section 12 in the first example implementation.

As described above, the high refractive index layers 30C, 30D, 30E, 30F and the first cladding layers 20C, 20D, 20E, 20F may be combined, thereby achieving increase in the cut-off width and decrease in the FFP, also adjusting the aspect ratio by using the spot size converter section 14.

Figure 9:
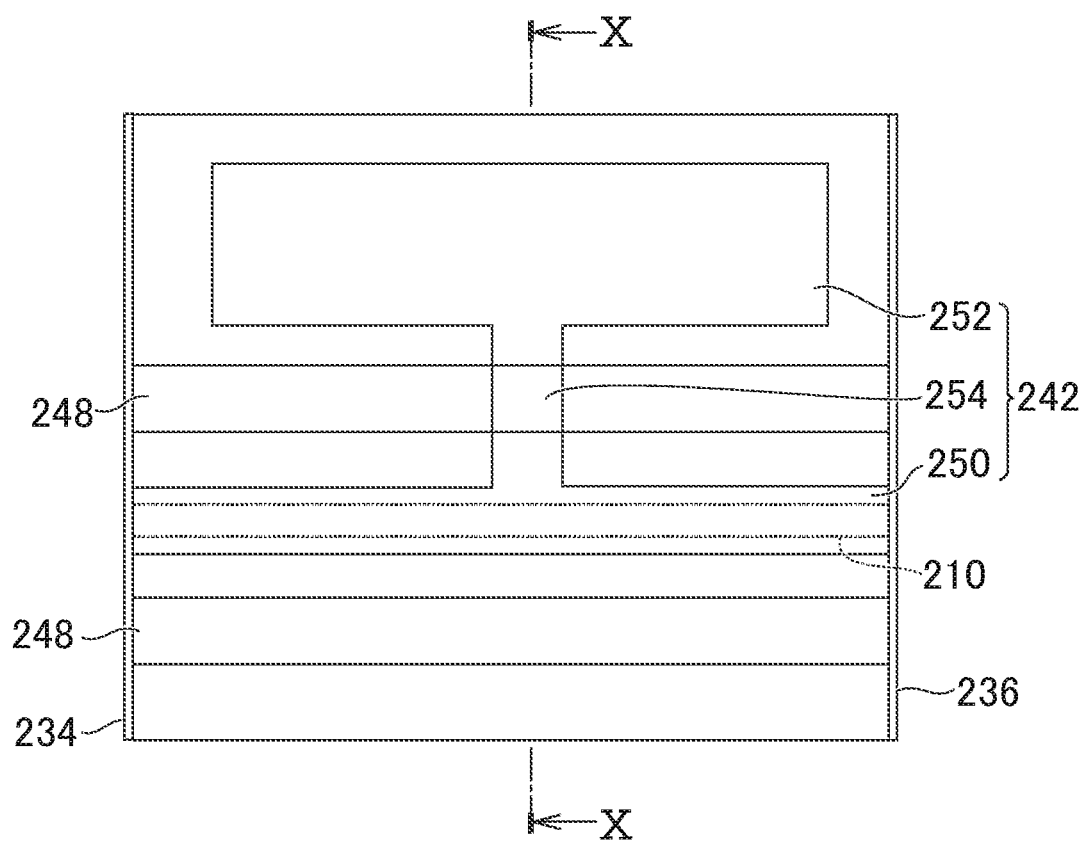
FIG. 9 is a plan view of a semiconductor laser according to a second example implementation.
Figure 10:
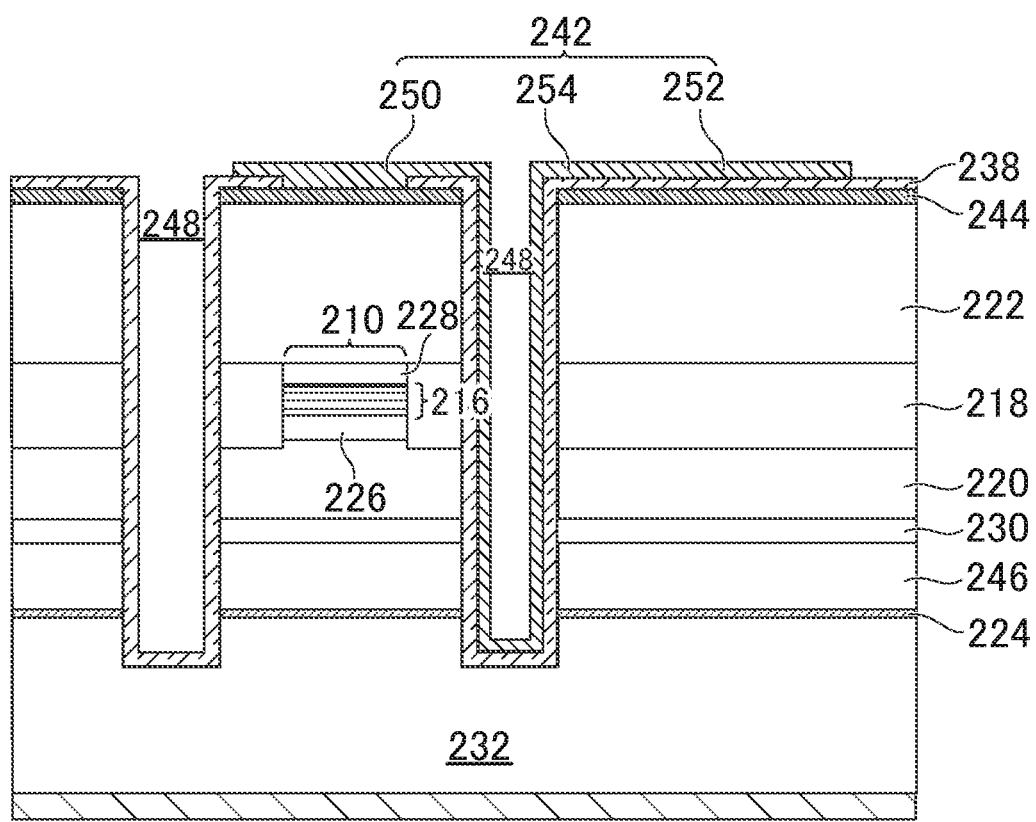
FIG. 10 is a X-X cross-sectional view of a semiconductor laser shown in FIG. 9.

FIG. 9 is a plan view of a semiconductor laser according to a second example implementation. FIG. 10 is a X-X cross-sectional view of a semiconductor laser shown in FIG. 9. The semiconductor laser may be a direct modulation type semiconductor laser, and may be a DFB laser where light oscillates in a 1.3 μm band or a 1.55 μm band. The semiconductor laser may include a planar buried heterostructure (PBH).

The mesa structure 210 may include the first SCH layer 226, the multi-quantum well layer 216, and the second SCH layer 228. The first SCH layer 226 may have the first conductivity type, and the second SCH layer 228 may have the second conductivity type. In the PBH, the mesa structure 210 may be lower than the BH because it does not include the second cladding layer 222.

The buried layer 218 may be disposed on each of both sides of the mesa structure 210. In the PBH, the mesa structure 210 may be lower as compared with the BH shown in FIG. 3, so the buried layer 218 may be thin, leading to improved manufacturability. The mesa structure 210 not have a spot size converter section.

The second cladding layer 222 may be on the multi-quantum well layer 216 and the buried layer 218. Or, the second cladding layer 222 may be on the mesa structure 210 and the buried layer 218. The second cladding layer 222 may have the second conductivity type (e.g., p-type), and may be comprised of an InP layer. A contact layer 244 may be disposed on the second cladding layer 222. The contact layer 244 may have the second conductivity type and may be made of InGaAs. The PBH may be a structure where the second cladding layer 222 and the contact layer 244 may be widely disposed on the mesa structure 210.

A third cladding layer 246 may be between the high refractive index layer 230 and the substrate 232. The high refractive index layer 230 and the first cladding layer 220 may be stacked on the third cladding layer 246. The third cladding layer 246 may have the first conductivity type (e.g., n-type), and may comprise InP.

The diffraction grating layer 224 may be between the third cladding layer 246 and the substrate 232. The third cladding layer 246 may be disposed on the diffraction grating layer 224. The diffraction grating layer 224 may be provided on the substrate 232. The diffraction grating layer 224 may be closer to the substrate 232 than the high refractive index layer 230, but may serve as a diffraction grating by adjustment of the thickness of the third cladding layer 246, whereby the semiconductor laser may be driven as a DFB laser.

The semiconductor laser may include a pair of grooves 248. The pair of grooves 248, along a direction in which the mesa structure 210 extends, may be formed to extend to two end faces (an end face where the low reflection coating film 234 may be formed and another end face where the high reflection coating film 236 may be formed). The pair of grooves 248 may be formed to have a depth from a surface of the uppermost layer (e.g., contact layer 244) of the semiconductor laminate to the substrate 232. The pair of grooves 248 may have a depth reaching the substrate 232 through the buried layer 218 and the first cladding layer 220.

An insulating film 238 may be disposed on the surface of the uppermost layer of the semiconductor laminate, except for an upper region of the mesa structure 210, and may be disposed on an inner surface of the pair of grooves 248. A surface electrode 242 may include a mesa top electrode 250 extending along the mesa structure 210, a pad electrode 252 disposed on only one side next to the mesa structure 210, and a draw-out electrode 254 connected therebetween. The draw-out electrode 254 may be in contact with the inner surface of one of the pair of grooves 248.

The mesa structure 210 may be between the pair of grooves 248. The mesa structure 210 may be positioned away from a center of the semiconductor laser in a direction away from the pad electrode 252. The light may be guided around the mesa structure 210 to be spread horizontally in FIG. 10. The pair of grooves 248 may be disposed in regions that put substantially no impact on the values of the FFP. That is, the light that may be substantially coupled to an external lens remains in a region between the pair of grooves 248.

In the PBH, the contact layer 244 may be widely provided, so parasitic capacitance may be large compared with the BH. However, the pair of grooves 248 can diminish an area, directly conductive to the second cladding layer 222, of the contact layer 244, thereby making it possible to reduce the parasitic capacitance.

The pair of grooves 248 may separate the high refractive index layer 230 and the first cladding layer 220. Thus, although the light does not spread in the region beyond the pair of grooves 248, similarly to the first example implementation, the high-order transverse mode cut-off width can be broader, enabling a high power output of a single-mode transmission.

The high refractive index layer 230 may not be included in the mesa structure 210 which may include the multi-quantum well layer 216, may be wider than the mesa structure 210, and may continuously overlap the entire mesa structure 210 and at least part (between the pair of grooves 248) of the buried layer 218.

In a first implementation, a semiconductor laser includes: a multi-quantum well layer 16 included in a mesa structure 10; a buried layer 18 made of a semi-insulating semiconductor, the buried layer 18 being in contact with each of both sides of the mesa structure 10; a first cladding layer 20 with a first conductivity type, under the mesa structure 10 and the buried layer 18, the first cladding layer 20 having a lower refractive index than the multi-quantum well layer 16; a high refractive index layer 30 configured to not absorb light oscillating in the multi-quantum well layer 16, under the mesa structure 10 and the buried layer 18, below the first cladding layer 20, the high refractive index layer 30 having a higher refractive index than the first cladding layer 20; a diffraction grating layer 24 at least partially constituting a diffraction grating capable of diffracting the light oscillating in the multi-quantum well layer 16, the diffraction grating layer 24 being not contacting the high refractive index layer 30; a substrate 32 with the first conductivity type, below the high refractive index layer 30; and a second cladding layer 22 with a second conductivity type opposite to the first conductivity type, above the multi-quantum well layer 16.

In a second implementation, alone or in combination with the first implementation, the semiconductor laser further includes a first SCH layer 26 with the first conductivity type, between the multi-quantum well layer 16 and the first cladding layer 20, the first SCH layer 26 being included in the mesa structure 10; and a second SCH layer 28 with the second conductivity type, between the multi-quantum well layer 16 and the second cladding layer 22, the second SCH layer 28 being included in the mesa structure 10.

In a third implementation, alone or in combination with one or more of the first and second implementations, the first cladding layer 20 has a thickness of 500 nm or more.

In a fourth implementation, alone or in combination with one or more of the first through third implementations, the first cladding layer 20 has a thickness of 1500 nm or less.

In a fifth implementation, alone or in combination with one or more of the first through fourth implementations, the high refractive index layer 30 has a thickness of 50 nm or more.

In a sixth implementation, alone or in combination with one or more of the first through fifth implementations, the high refractive index layer 30 has a thickness of 100 nm or less.

In a seventh implementation, alone or in combination with one or more of the first through sixth implementations, the first cladding layer 20 is one of multiple first cladding layers 20A-20F, the high refractive index layer 30 is one of multiple high refractive index layers 30A-30F, and the multiple first cladding layers 20A-20F and the multiple high refractive index layers 30A-30F are alternately stacked.

In an eighth implementation, alone or in combination with one or more of the first through seventh implementations, the multiple first cladding layers 20A-20F are different in thicknesses, being thicker when closer to the multi-quantum well layer 16.

In a ninth implementation, alone or in combination with one or more of the first through eighth implementations, the multiple high refractive index layers 30A-30F comprises two layers: an upper layer closer to the multi-quantum well layer 16 and a lower layer farther from the multi-quantum well layer 16, and the upper layer is thinner than the lower layer.

In a tenth implementation, alone or in combination with one or more of the first through ninth implementations, the multiple high refractive index layers 30A-30F include an uppermost layer closest to the multi-quantum well layer 16, a lowermost layer farthest from the multi-quantum well layer 16, and at least one intermediate layer between the uppermost layer and the lowermost layer, and the at least one intermediate layer is thinner than either of the uppermost layer and the lowermost layer.

In an eleventh implementation, alone or in combination with one or more of the first through tenth implementations, the mesa structure 10 includes a spot size converter section 14 gradually decreasing in width perpendicular to a light emission direction, and the diffraction grating layer 24, at the spot size converter section 14, constitutes a grating configured not to diffract the light oscillating in the multi-quantum well layer 16.

In an twelfth implementation, alone or in combination with one or more of the first through eleventh implementations, the second cladding layer 22 is included in the mesa structure 10.

In a thirteenth implementation, alone or in combination with one or more of the first through twelfth implementations, the diffraction grating layer 24 is inside the second cladding layer 22.

In a fourteenth implementation, alone or in combination with one or more of the first through thirteenth implementations, the second cladding layer 222 is on the multi-quantum well layer 216 and the buried layer 218.

In a fifteenth implementation, alone or in combination with one or more of the first through fourteenth implementations, the semiconductor laser further includes a third cladding layer 246 between the high refractive index layer 230 and the substrate 232, wherein the diffraction grating layer 224 is between the third cladding layer 246 and the substrate 232.

In a sixteenth implementation, alone or in combination with one or more of the first through fifteenth implementations, the mesa structure 210 is between a pair of grooves 248 with depth of being through the buried layer 218 and the first cladding layer 220 to the substrate 232.

In a seventeenth implementation, alone or in combination with one or more of the first through sixteenth implementations, the first conductivity type is an n-type, and the second conductivity type is a p-type.

In an eighteenth implementation, alone or in combination with one or more of the first through seventeenth implementations, the high refractive index layer 30 comprises at least one of InGaAsP, InGaAs, or InGaAlAs.

In an nineteenth implementation, alone or in combination with one or more of the first through eighteenth implementations, at least one of the substrate 32, the buried layer 18, the first cladding layer 20, or the second cladding layer 22 comprises InP.

In a twentieth implementation, alone or in combination with one or more of the first through nineteenth implementations, the high refractive index layer 30 has a lower refractive index than the multi-quantum well layer 16.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor laser comprising:
    a multi-quantum well layer included in a mesa structure;
    a buried layer comprising a semi-insulating semiconductor,
        wherein the buried layer is in contact with a first side and a second side of the mesa structure;
    a first cladding layer with a first conductivity type, under the mesa structure and the buried layer, wherein
        the first cladding layer has a lower refractive index than the multi-quantum well layer,
            the first cladding layer is one of a pair of first cladding layers, and
            a thickness of one of the pair of first cladding layers that is adjacent to the multi-quantum well layer is greater than a thickness of another of the pair of first cladding layers;
    a high refractive index layer configured to not absorb light oscillating in the multi-quantum well layer, under the mesa structure and the buried layer, below the first cladding layer, wherein:
        the high refractive index layer has a higher refractive index than the first cladding layer, and
        the high refractive index layer is one of a pair of high refractive index layers that are alternately stacked with the pair of first cladding layers;
    a diffraction grating layer at least partially constituting a diffraction grating capable of diffracting the light oscillating in the multi-quantum well layer,
        wherein the diffraction grating layer does not contact the high refractive index layer;
    a substrate with the first conductivity type, below the high refractive index layer; and
    a second cladding layer with a second conductivity type opposite to the first conductivity type, above the multi-quantum well layer.

2. The semiconductor laser according to claim 1, further comprising:
    a first separate confinement heterostructure layer with the first conductivity type, between the multi-quantum well layer and the first cladding layer, the first separate confinement heterostructure layer being included in the mesa structure; and
    a second separate confinement heterostructure layer with the second conductivity type, between the multi-quantum well layer and the second cladding layer, the second separate confinement heterostructure layer being included in the mesa structure.

3. The semiconductor laser according to claim 1, wherein the first cladding layer has a thickness of 500 nm or more.

4. The semiconductor laser according to claim 3, wherein the first cladding layer has a thickness of 1500 nm or less.

5. The semiconductor laser according to claim 1, wherein the high refractive index layer has a thickness of 50 nm or more.

6. The semiconductor laser according to claim 5, wherein the high refractive index layer has a thickness of 100 nm or less.

7. The semiconductor laser according to claim 1, wherein
    the pair of high refractive index layers comprises two layers: an upper layer closer to the multi-quantum well layer and a lower layer farther from the multi-quantum well layer, and
    the upper layer is thinner than the lower layer.

8. The semiconductor laser according to claim 1, wherein
    the pair of high refractive index layers include a first high refractive index layer that is closest to the multi-quantum well layer and a second high refractive index layer that is farther from the multi-quantum well layer than the first high refractive index layer,
        the semiconductor laser further includes a third high refractive index layer that is farthest from the multi-quantum well layer relative to the first high refractive index layer and the second high refractive index layer, and
        the second high refractive index layer is thinner than either the first high refractive index layer or the third high refractive index layer.

9. The semiconductor laser according to claim 1, wherein
    the mesa structure includes a spot size converter section gradually decreasing in width perpendicular to a light emission direction, and
    the diffraction grating layer, at the spot size converter section, constitutes a grating configured not to diffract the light oscillating in the multi-quantum well layer.

10. The semiconductor laser according to claim 1, wherein the second cladding layer is included in the mesa structure.

11. The semiconductor laser according to claim 10, wherein the diffraction grating layer is inside the second cladding layer.

12. The semiconductor laser according to claim 1, wherein the second cladding layer is on the multi-quantum well layer and the buried layer.

13. The semiconductor laser according to claim 12, further comprising a third cladding layer between the high refractive index layer and the substrate,
    wherein the diffraction grating layer is between the third cladding layer and the substrate.

14. The semiconductor laser according to claim 12, wherein the mesa structure is between a pair of grooves with depth of being through the buried layer and the first cladding layer to the substrate.

15. The semiconductor laser according to claim 1, wherein the first conductivity type is an n-type, and the second conductivity type is a p-type.

16. The semiconductor laser according to claim 1, wherein the high refractive index layer comprises at least one of InGaAsP, InGaAs, or InGaAlAs.

17. The semiconductor laser according to claim 1, wherein at least one of the substrate, the buried layer, the first cladding layer, or the second cladding layer comprises InP.

18. The semiconductor laser according to claim 1, wherein the high refractive index layer has a lower refractive index than the multi-quantum well layer.

19. A semiconductor laser comprising:
   a multi-quantum well layer included in a mesa structure;
   a buried layer comprising a semi-insulating semiconductor, the buried layer being in contact with a first side and a second side of the mesa structure;
   a first cladding layer with a first conductivity type, under the mesa structure and the buried layer, wherein
      the first cladding layer has a lower refractive index than the multi-quantum well layer, and
      the first cladding layer is one of multiple first cladding layers;
   a high refractive index layer configured to not absorb light oscillating in the multi-quantum well layer, under the mesa structure and the buried layer, below the first cladding layer, wherein
      the high refractive index layer has a higher refractive index than the first cladding layer,
         the high refractive index layer is one of multiple high refractive index layers, and
         the multiple high refractive index layers comprise:
            an upper layer that is closer to the multi-quantum well layer, and
            a lower layer that is farther from the multi-quantum well layer,
               wherein the lower layer is thicker than the upper layer;
   a diffraction grating layer at least partially constituting a diffraction grating capable of diffracting the light oscillating in the multi-quantum well layer,
      wherein the diffraction grating layer does not contact the high refractive index layer;
   a substrate with the first conductivity type, below the high refractive index layer; and
   a second cladding layer with a second conductivity type opposite to the first conductivity type, above the multi-quantum well layer.

20. The semiconductor laser according to claim 19, wherein the multiple high refractive index layers further comprise:
   a lowest layer that is farthest, of the multiple high refractive index layers, from the multi-quantum well layer,
      wherein the lowest layer is thinnest of the multiple high refractive index layers.

* * * * *